(12) United States Patent  
Oh

(10) Patent No.: US 10,756,044 B2  
(45) Date of Patent: Aug. 25, 2020

(54) FAN-OUT SEMICONDUCTOR PACKAGE

(71) Applicant: SAMSUNG ELECTRONICS CO., LTD., Suwon-si (KR)

(72) Inventor: Sang Hyuck Oh, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/941,405

(22) Filed: Mar. 30, 2018

(65) Prior Publication Data

US 2019/0172809 A1 Jun. 6, 2019

(30) Foreign Application Priority Data

Dec. 6, 2017 (KR) .................. 10-2017-0166708

(51) Int. Cl.
*H01L 23/00* (2006.01)
*H01L 23/538* (2006.01)
(Continued)

(52) U.S. Cl.
CPC .......... *H01L 24/24* (2013.01); *H01L 23/3128* (2013.01); *H01L 23/5383* (2013.01); *H01L 23/5384* (2013.01); *H01L 23/5386* (2013.01); *H01L 23/5389* (2013.01); *H01L 24/19* (2013.01); *H01L 24/20* (2013.01); *H01L 25/16* (2013.01); *H01L 2224/13101* (2013.01); *H01L 2224/211* (2013.01); *H01L 2224/24101* (2013.01); *H01L 2224/24195* (2013.01); *H01L 2224/73204* (2013.01);
(Continued)

(58) Field of Classification Search
None
See application file for complete search history.

(56) References Cited

U.S. PATENT DOCUMENTS

2006/0283629 A1 12/2006 Kikuchi et al.
2010/0314742 A1 12/2010 Kim
(Continued)

FOREIGN PATENT DOCUMENTS

JP      2006-351963 A    12/2006
KR   10-2010-0134229 A    12/2010
(Continued)

OTHER PUBLICATIONS

Communication dated Mar. 26, 2019, issued by the Korean Intellectual Property Office in counterpart Korean Application No. 10-2017-0166708.
(Continued)

*Primary Examiner* — Walter H Swanson
*Assistant Examiner* — Kien C Ly
(74) *Attorney, Agent, or Firm* — Sughrue Mion, PLLC

(57) ABSTRACT

A fan-out semiconductor package includes a connection member including an insulating layer, a redistribution layer, and conductive vias penetrating through the insulating layer and connected to the redistribution layer, and a semiconductor chip and a passive chip disposed on the connection member and electrically connected to the redistribution layer. A conductive via connected to the passive element among the conductive vias has a multiple via shape in which a plurality of sub-vias, a width of each sub-via is decreased in a thickness direction, and end portions of the plurality of sub-vias are integrated with each other.

19 Claims, 13 Drawing Sheets

(51) Int. Cl.
*H01L 25/16* (2006.01)
*H01L 23/31* (2006.01)

(52) U.S. Cl.
CPC ............ *H01L 2924/1431* (2013.01); *H01L 2924/1433* (2013.01); *H01L 2924/1436* (2013.01); *H01L 2924/15174* (2013.01); *H01L 2924/15311* (2013.01); *H01L 2924/181* (2013.01); *H01L 2924/18162* (2013.01); *H01L 2924/19105* (2013.01); *H01L 2924/3511* (2013.01)

(56) References Cited

U.S. PATENT DOCUMENTS

| | | | |
|---|---|---|---|
| 2012/0235309 A1* | 9/2012 | Essig | H01L 23/488 257/782 |
| 2014/0182896 A1* | 7/2014 | Lee | H05K 1/185 174/251 |
| 2014/0264800 A1* | 9/2014 | Gowda | H01L 24/83 257/675 |
| 2015/0287708 A1* | 10/2015 | Lin | H01L 2/76877 438/109 |
| 2016/0338202 A1 | 11/2016 | Park et al. | |
| 2017/0141056 A1 | 5/2017 | Huang et al. | |
| 2017/0278812 A1 | 9/2017 | Lee et al. | |
| 2017/0287853 A1 | 10/2017 | Kim et al. | |
| 2017/0309571 A1 | 10/2017 | Yi et al. | |

FOREIGN PATENT DOCUMENTS

| | | |
|---|---|---|
| KR | 10-1524490 B1 | 6/2015 |
| KR | 10-2016-0132751 A | 11/2016 |
| KR | 10-2017-0112905 A | 10/2017 |
| KR | 10-2017-0112907 A | 10/2017 |
| KR | 10-2017-0121671 A | 11/2017 |

OTHER PUBLICATIONS

Office Action issued in corresponding Korean Patent Application No. 10-2017-0166708, dated Sep. 17, 2018.
Taiwanese Office Action dated Jan. 24, 2019 issued in Taiwanese Patent Application No. 107111654 (with English translation).

* cited by examiner

I-I'

FAN-OUT SEMICONDUCTOR PACKAGE

CROSS-REFERENCE TO RELATED APPLICATION(S)

This application claims benefit of priority to Korean Patent Application No. 10-2017-0166708 filed on Dec. 6, 2017 in the Korean Intellectual Property Office, the disclosure of which is incorporated herein by reference in its entirety.

TECHNICAL FIELD

The present disclosure relates to a semiconductor package, and more particularly, to a fan-out semiconductor package in which electrical connection structures may extend outwardly of a region in which a semiconductor chip is are disposed.

BACKGROUND

A significant recent trend in the development of technology related to semiconductor chips has been reductions in the size of semiconductor chips. Therefore, in the field of package technology, in accordance with a rapid increase in demand for small-sized semiconductor chips, or the like, the implementation of a semiconductor package having a compact size while including a plurality of pins has been demanded.

One type of semiconductor package technology suggested to satisfy the technical demand as described above is a fan-out semiconductor package. Such a fan-out package has a compact size and may allow a plurality of pins to be implemented by redistributing connection terminals outwardly of a region in which a semiconductor chip is disposed.

Such a semiconductor package may be implemented in a form of a multi-chip package in which a plurality of semiconductor chips, passive elements, and the like are packaged at a time, and a stable electrical connection structure between the semiconductor chips, the passive elements, and the like is thus required.

SUMMARY

An aspect of the present disclosure may provide a fan-out semiconductor package having a stable electrical connection structure.

According to an aspect of the present disclosure, a fan-out semiconductor package may include a connection member including an insulating layer, a redistribution layer, and conductive vias penetrating through the insulating layer and connected to the redistribution layer; and a semiconductor chip and a passive chip disposed on the connection member and electrically connected to the redistribution layer. A conductive via connected to the passive element among the conductive vias may have a multiple via shape including a plurality of vias, a width of each sub-via is decreased in a thickness direction, and first end portions of the plurality of sub-vias are integrated each other.

The passive element may be connected to second end portions of the plurality of sub-vias opposing the first end portions.

The second end portions of the plurality of sub-vias connected to the passive element may be separated from each other.

The insulating layer may fill spaces between the second end portions of the plurality of sub-vias.

The first end portions of the plurality of sub-vias may be integrated with the redistribution layer.

A region of the redistribution layer opposing the plurality of sub-vias may have a convex shape.

The region of the redistribution layer having the convex shape may be a region corresponding to one of the plurality of sub-vias.

Each of the plurality of sub-vias may have a quasi conical shape in which a lower surface and an upper surface have a circular shape.

One or more of the conductive vias which are not connected to the passive element among the conductive vias may have the multiple vias shape.

The fan-out semiconductor package may further include a core member disposed on the connection member and having a through-hole.

The semiconductor chip and the passive element may be disposed in the through-hole.

The through-hole may include a first through-hole in which the semiconductor chip is disposed and a second through-hole in which the passive element is disposed.

The core member may have a through-wiring structure.

The core member may include a first insulating layer, a first wiring layer in contact with the connection member and embedded in the first insulating layer, and a second wiring layer disposed on the other surface of the first insulating layer opposing one surface of the first insulating layer in which the first wiring layer is embedded. The first and second wiring layers may be electrically connected to the semiconductor chip.

The core member may further include a second insulating layer disposed on the first insulating layer and covering the second wiring layer and a third wiring layer disposed on the second insulating layer. The third wiring layer may be electrically connected to the semiconductor chip.

The core member may include a first insulating layer, a first wiring layer and a second wiring layer disposed on opposite surfaces of the first insulating layer, respectively, a second insulating layer disposed on the first insulating layer and covering the first wiring layer, and a third wiring layer disposed on the second insulating layer. The first to third wiring layers may be electrically connected to the semiconductor chip.

The core member may further include a third insulating layer disposed on the first insulating layer and covering the second wiring layer and a fourth wiring layer disposed on the third insulating layer. The fourth wiring layer may be electrically connected to the semiconductor chip.

The plurality of sub-vias may be in direct contact with a terminal of the passive chip.

According to an aspect of the present disclosure, a package may include: a connection member including an insulating layer, a redistribution layer, and conductive vias penetrating through the insulating layer and connected to the redistribution layer; and a passive component or a semiconductor chip disposed on the connection member and electrically connected to the redistribution layer. One of the conductive vias may have a multiple via shape including a plurality of sub-vias. A conductive pattern of the redistribution layer, on which the plurality of sub-vias are disposed, may have a plurality of convex structures opposing the plurality of sub-vias.

Side surfaces of adjacent ones of the plurality of sub-vias may be in contact with each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or stylized for clarity.

Electronic Device

Figure 1:
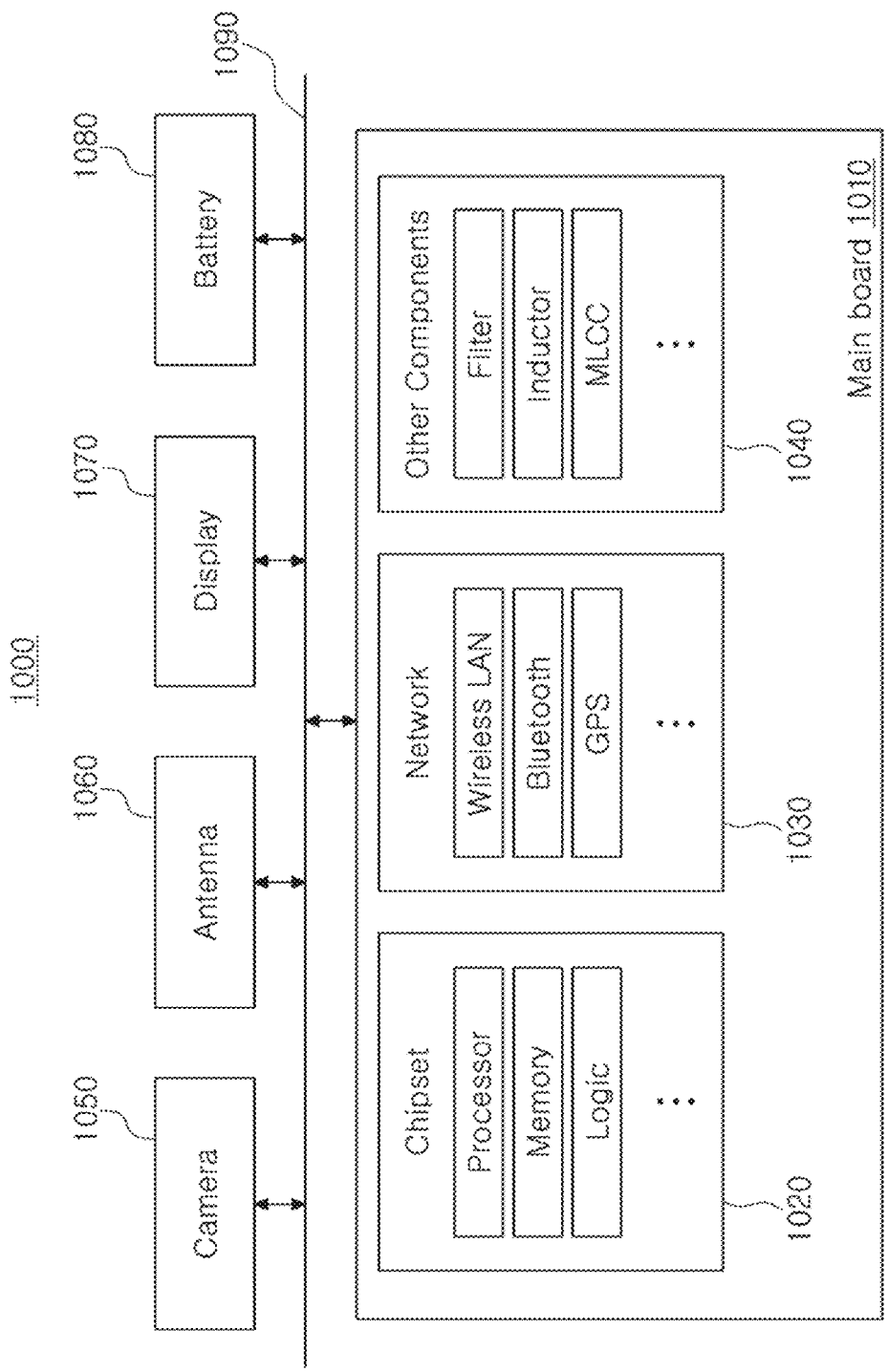
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, and may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-firing ceramic (LTCC), an electromagnetic interference (EMI) filter, a multilayer ceramic capacitor (MLCC), and the like. However, other components 1040 are not limited thereto, and may also include passive components used for various other purposes, and the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet personal computer (PC), a laptop PC, a netbook PC, a television, a video game machine, a smartwatch, an automotive, or the like. However, the electronic device 1000 is not limited thereto, and may be any other electronic device processing data.

Figure 2:
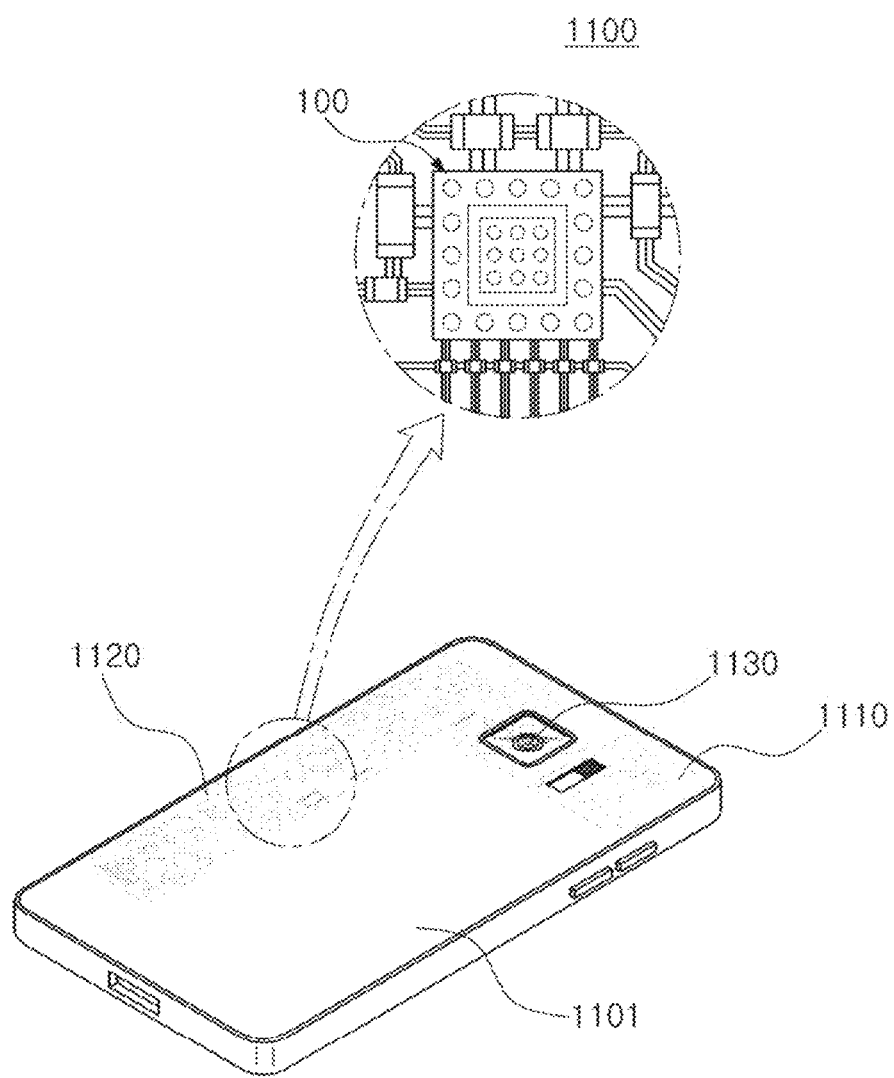
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various components 1120 may be physically or electrically connected to the motherboard 1110. In addition, other components that may or may not be physically or electrically connected to the mainboard 1010, such as a camera 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, and may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, and may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will be described hereinafter in more detail with reference to the drawings.

Fan-in Semiconductor Package

Figure 3A:
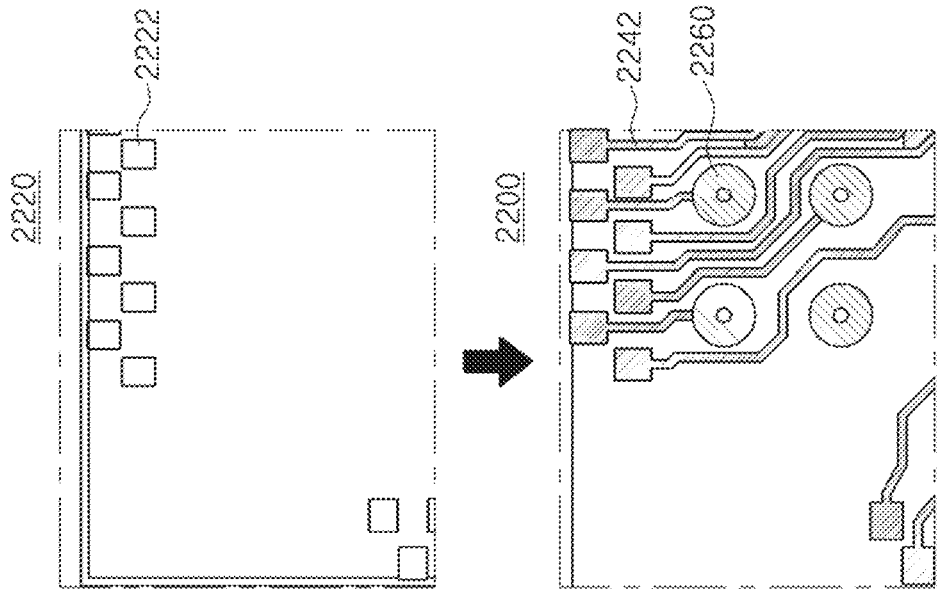
FIGS. 3A and 3B are schematic cross-sectional views illustrating states of a fan-in semiconductor package before and after being packaged.
Figure 3B:
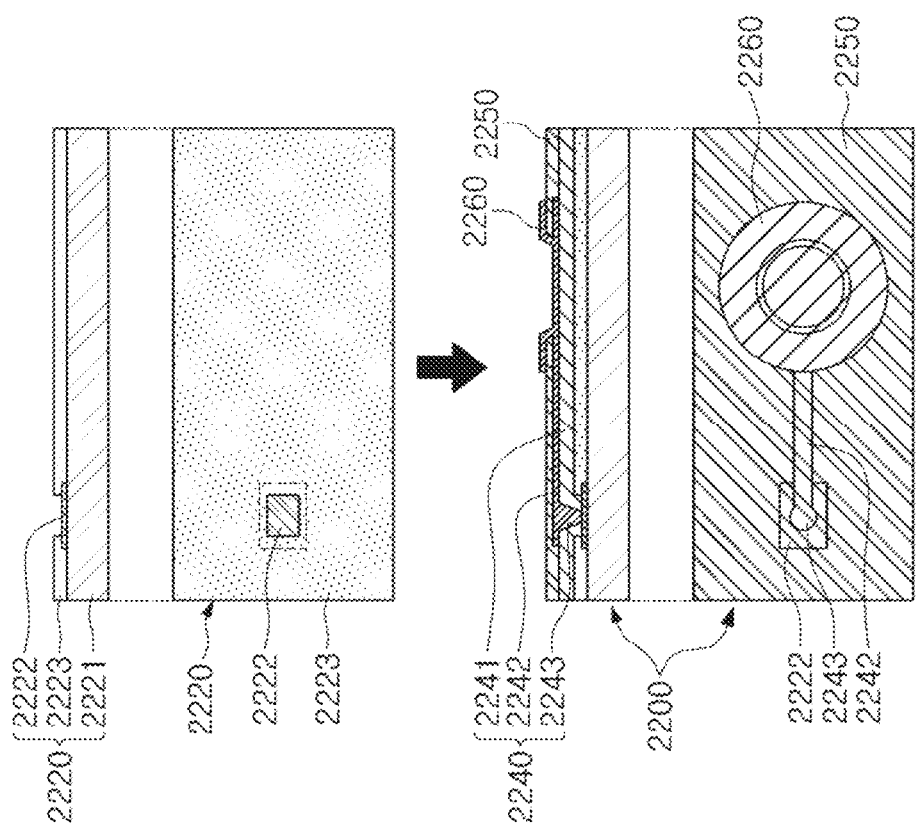

FIGS. 3A and 3B are schematic cross-sectional views illustrating states of a fan-in semiconductor package before and after being packaged.

Figure 4:
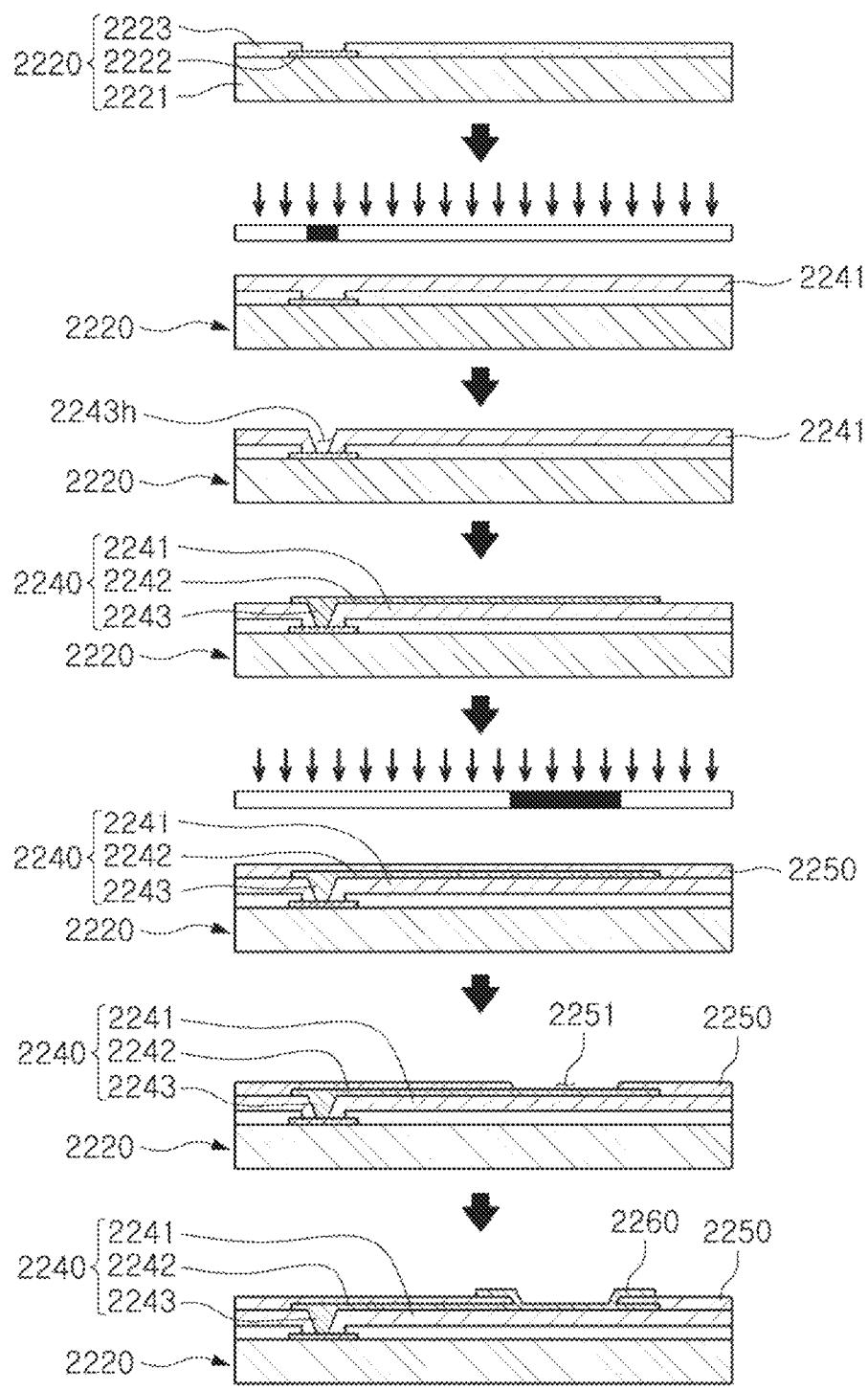
FIG. 4 is a schematic cross-sectional view illustrating a packaging process of a fan-in semiconductor package.

FIG. 4 is a schematic cross-sectional view illustrating a packaging process of a fan-in semiconductor package.

Referring to the drawings, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 are significantly small, it is difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as photo imagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the under-bump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
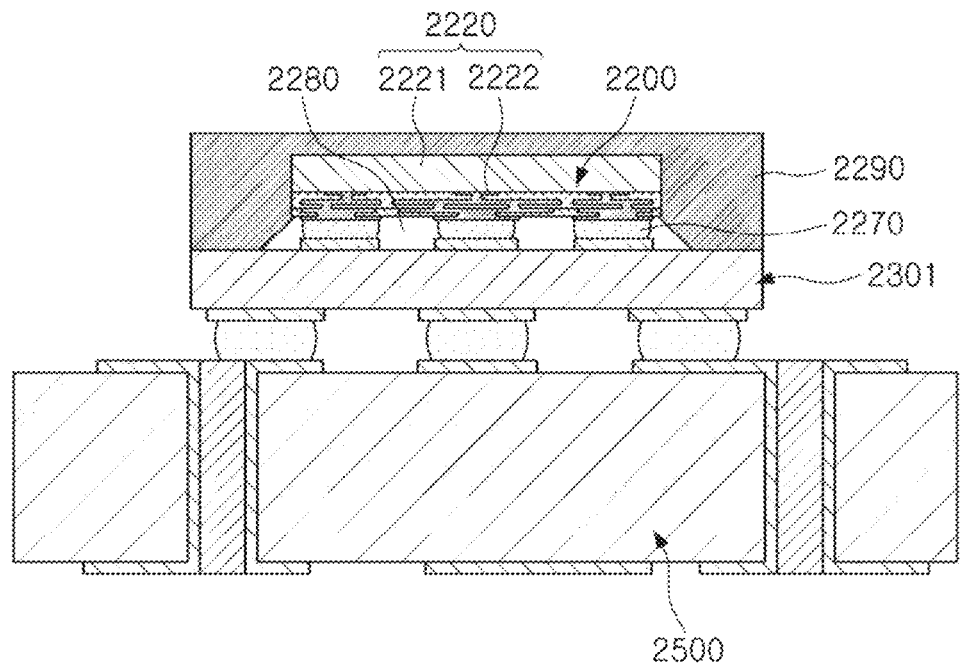
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
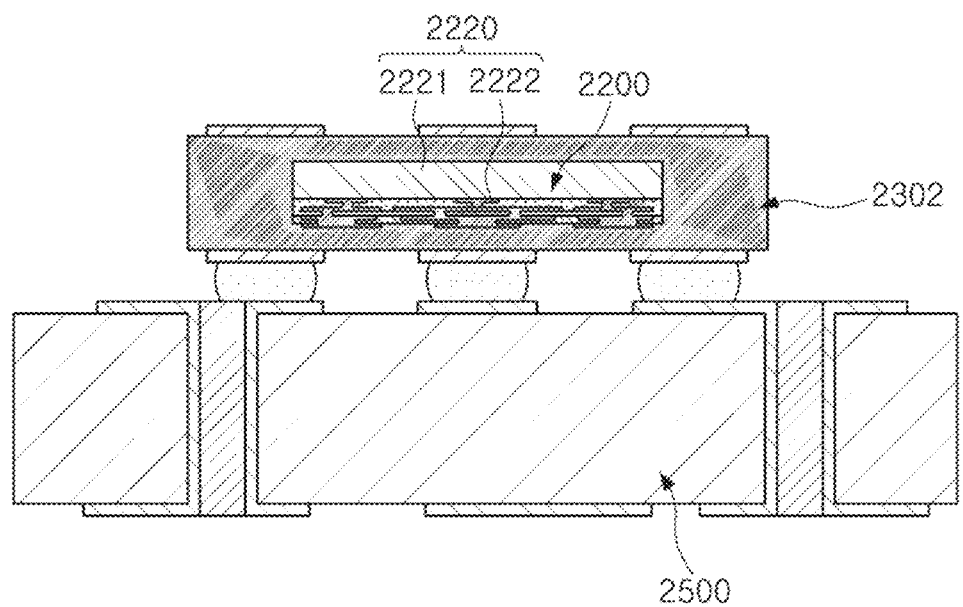
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
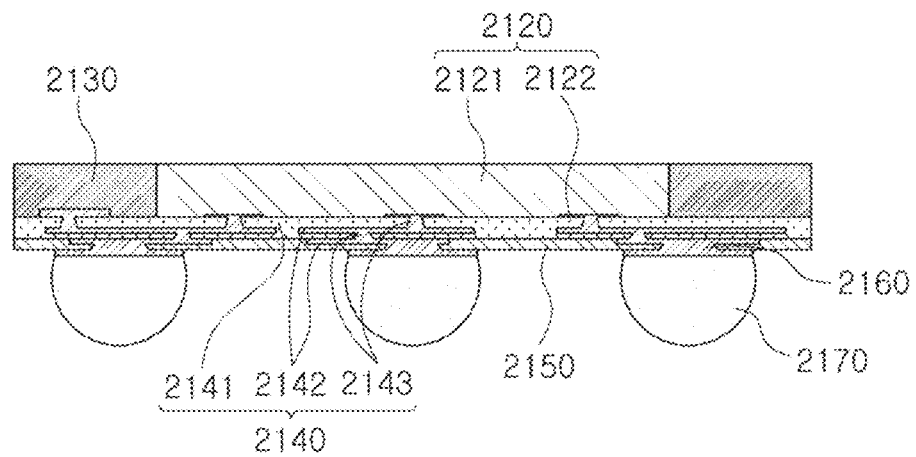
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2202 may further be formed on the connection member 2104, and an underbump metal layer 2106 may further be formed in openings of the passivation layer 2202. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
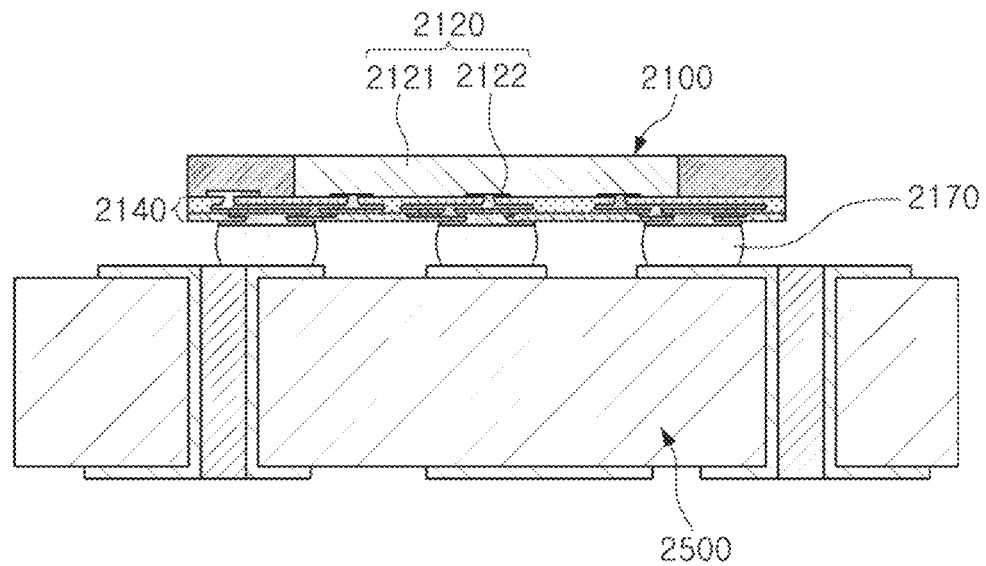
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is conceptually different from that of a printed circuit board (PCB) such as an interposer substrate, or the like, having a scale, a purpose, and the like, different from those of the fan-out semiconductor package, and having the fan-in semiconductor package embedded therein.

A fan-out semiconductor package according to exemplary embodiment in the present disclosure will be described hereinafter with reference to the drawings.

Figure 9:
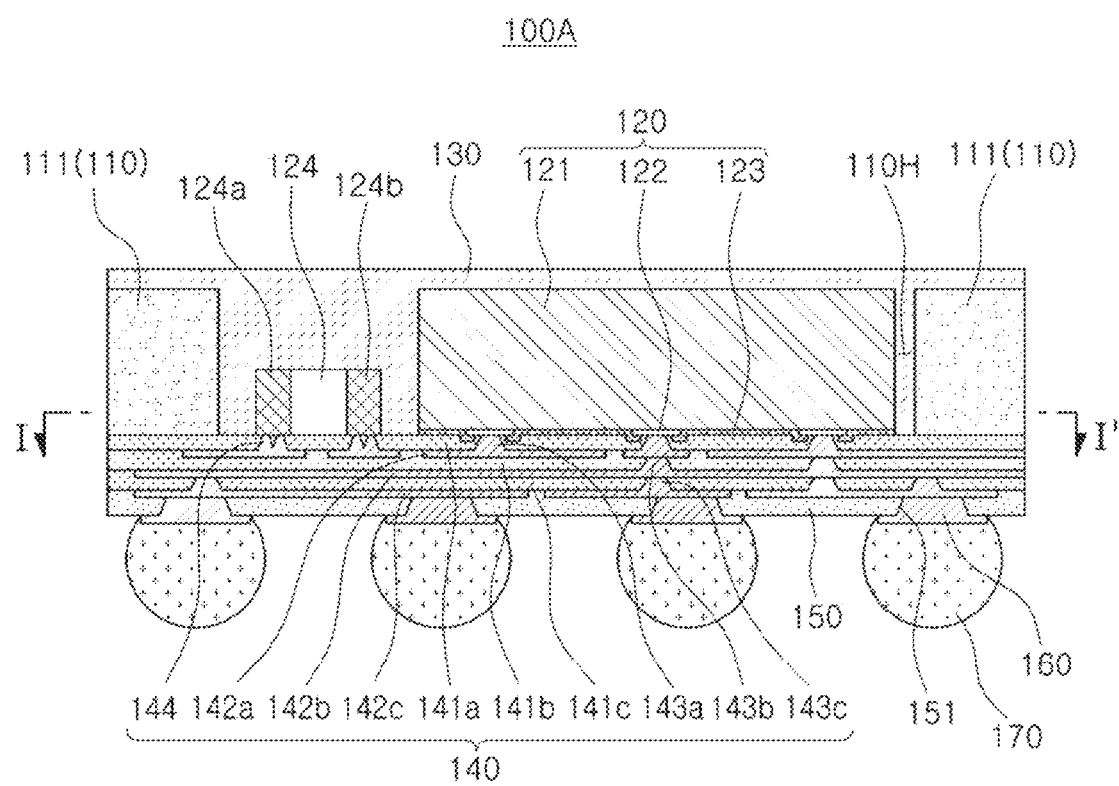
FIG. 9 is a schematic cross-sectional view illustrating an example of a fan-out semiconductor package.
Figure 10A:
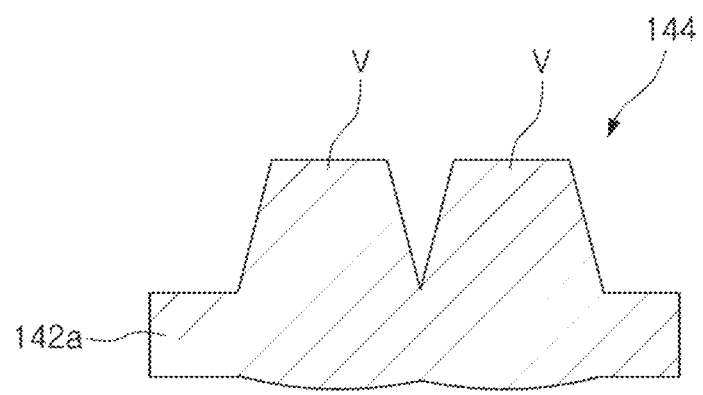
FIG. 10A illustrates an example of conductive vias which may be used in the fan-out semiconductor package of FIG. 9 and FIG. 10B illustrate a conventional example.
Figure 10B:
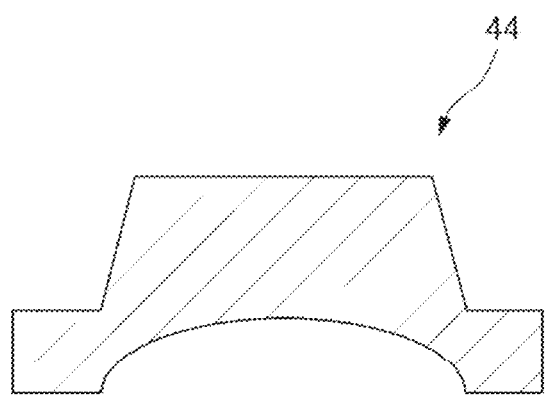
Figure 11:
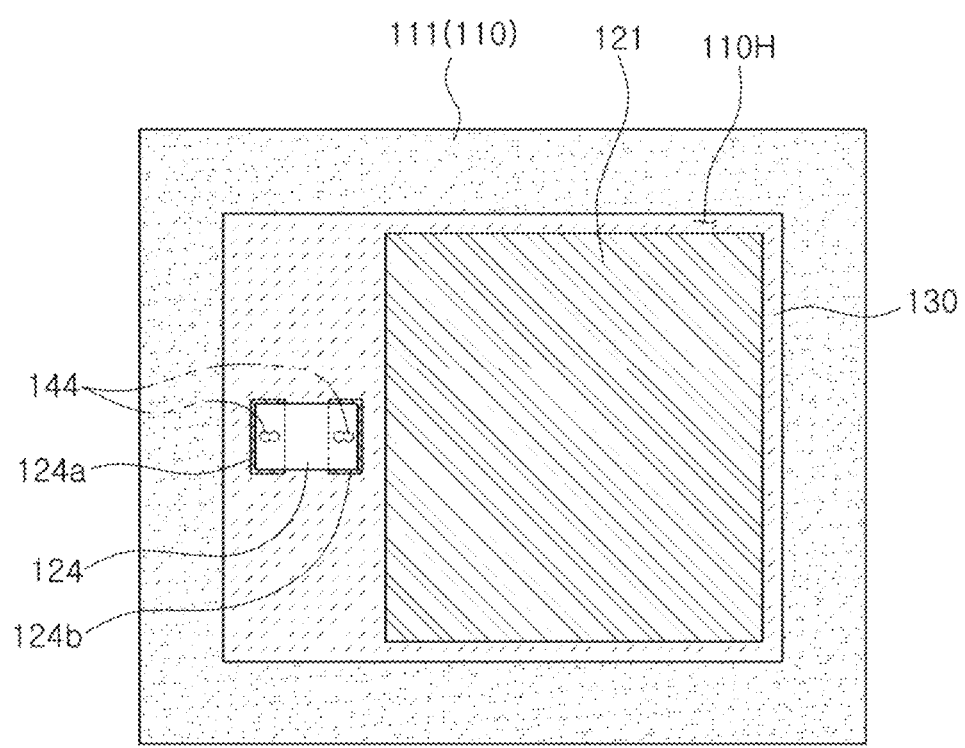
FIG. 11 is a schematic plan view taken along line I-I' of the fan-out semiconductor package of FIG. 9.
Figure 12:
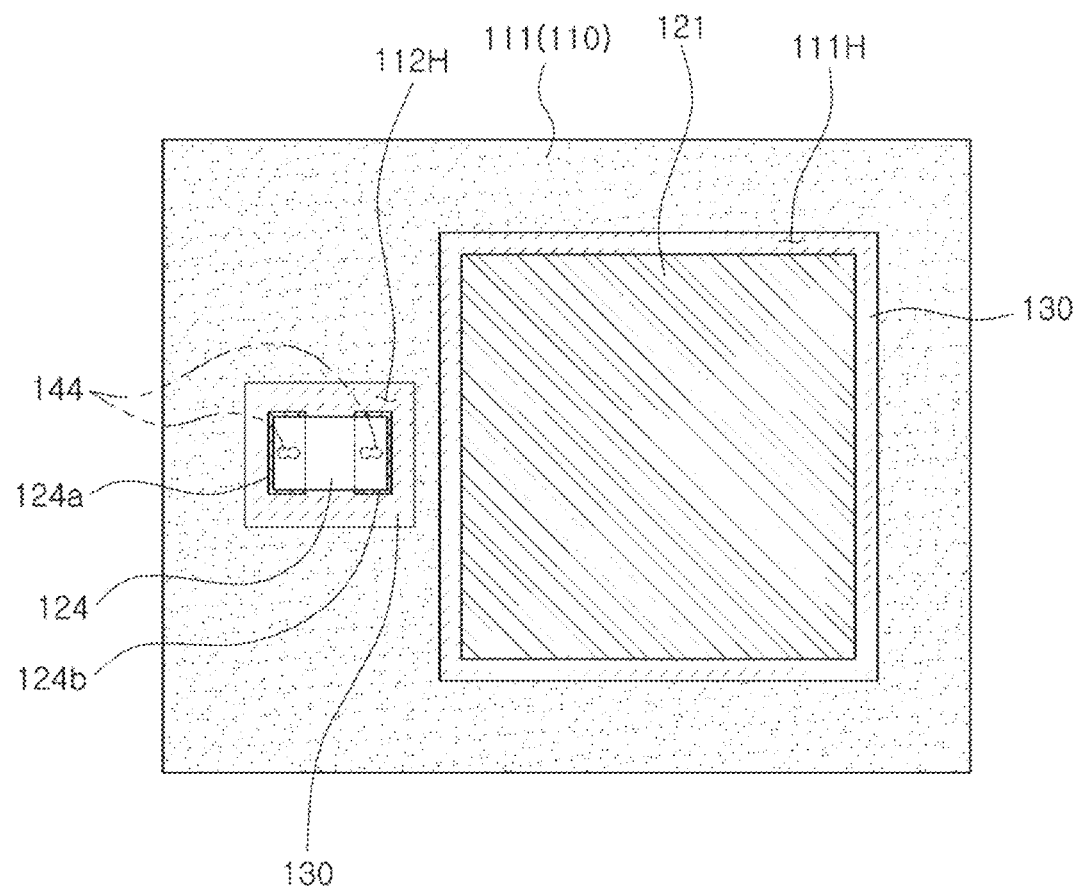
FIGS. 12 through 15 illustrate a fan-out semiconductor package according to a modified example.

FIG. 9 is a schematic cross-sectional view illustrating an example of a fan-out semiconductor package. FIG. 10A illustrates an example of conductive vias which may be used in the fan-out semiconductor package of FIG. 9 and FIG. 10B illustrates a conventional example. FIG. 11 is a schematic plan view taken along line I-I' of the fan-out semiconductor package of FIG. 9. FIGS. 12 through 15 illustrate a fan-out semiconductor package according to a modified example.

Referring to the drawings, a fan-out semiconductor package 100A according to an exemplary embodiment in the present disclosure may include a core member 110 having a through-hole 110H, a semiconductor chip 120, a passive element 124, an encapsulant 130, and a connection member 140, and a conductive via 144 connected to the passive element 124 among conductive vias 143a, 143b, and 143c included in the connection member 140 may have a multiple via shape in which a plurality of vias are integrated. According to the present exemplary embodiment, an electrical connection structure between the passive element 124 and the conductive via 144 may be stably secured by using such a multiple via shape. In addition to the components described above, the fan-out semiconductor package 100A may include a passivation layer 150, an underbump metal layer 160, an electrical connection structure 170, and the like.

The core member 110 may further improve rigidity of the fan-out semiconductor package 100A depending on certain materials, and serve to secure uniformity of a thickness of an encapsulant 130. When through-wirings, or the like, are formed in the core member 110 as in an exemplary embodiment to be described below, the fan-out semiconductor package 100A may be utilized as a package-on-package (POP) type package. According to the present exemplary embodiment, the core member 110 may have a through-hole 110H, and the semiconductor chip 120 and the passive element 124 may be disposed in the through-hole 110H. In this case, side surfaces of the semiconductor chip 120 and the passive elements 124 may be surrounded by the core member 110. However, such a form is only an example and may be variously modified to have other forms, and the core member 110 may perform another function depending on such a form. The core member 110 may be omitted, if necessary, but it may be more advantageous in securing board level reliability when the fan-out semiconductor package 100A includes the core member 110. In addition, although the present exemplary embodiment illustrates the form in which both of the semiconductor chip 120 and the passive element 124 are disposed in one through-hole 110H, each of the semiconductor chip 120 and the passive element 124 may also be disposed in different through-holes. In other words, as in a modified example of FIG. 12, the core member 110 may include a first cavity 111H in which the semiconductor chip 120 is disposed and a second cavity 112H in which the passive element 124 is disposed.

The core member 110 may include an insulating layer 111. An insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass fiber, a glass cloth or a glass fabric), for example, prepreg, Ajinomoto Build-up Film (ABF), FR-4, Bismaleimide Triazine (BT), or the like. Such a core member 110 may serve as a support member.

The semiconductor chip 120 may be an integrated circuit (IC) provided in an amount of several hundreds to several millions of elements or more integrated in a single chip. In this case, the IC may be, for example, a processor chip (more specifically, an application processor (AP)) such as a central processor (for example, a CPU), a graphic processor (for example, a GPU), a field programmable gate array (FPGA), a digital signal processor, a cryptographic processor, a micro processor, a micro controller, or the like, but is not limited thereto. That is, the IC may be a logic chip such as an analog-to-digital converter, an application-specific IC (ASIC), or the like, or a memory chip such as a volatile memory (for example, a DRAM), a non-volatile memory (for example, a ROM), a flash memory, or the like. In addition, the above-mentioned elements may also be combined with each other and be disposed.

The semiconductor chip 120 may be formed on the basis of an active wafer. In this case, a base material of a body 121 may be silicon (Si), germanium (Ge), gallium arsenide (GaAs), or the like. Various circuits may be formed on the body 121. The connection pads 122 may electrically connect the semiconductor chip 120 to other components. A material of each of the connection pads 122 may be a conductive material such as aluminum (Al), or the like. A passivation layer 123 exposing the connection pads 122 may be formed on the body 121, and may be an oxide film, a nitride film, or the like, or a double layer of an oxide layer and a nitride layer. A lower surface of the connection pad 122 may have a step with respect to a lower surface of the encapsulant 130 through the passivation layer 123. Resultantly, a phenomenon in which the encapsulant 130 bleeds into the lower surface of the connection pads 122 may be prevented to some extent. An insulating layer (not illustrated), and the like, may also be further disposed in other required positions. The semiconductor chip 120 may be a bare die, a redistribution layer (not illustrated) may further be formed on the active surface of the semiconductor chip 120, if necessary, and bumps (not illustrated), or the like, may be connected to the connection pads 122. Although the present exemplary embodiment describes an example in which one semiconductor chip 120 is used, two or more semiconductor chips may be used.

The passive element 124 may be a capacitor, an inductor, a resistor, or the like, and the same kind or other kinds of plurality of passive elements may also be used, if necessary. The passive element 124 may include a plurality of terminals 124a and 124b, and such terminals 124a and 124b may be stably connected to the conductive via 144 of a multiple via shape.

The encapsulant 130 may protect the core member 110, the semiconductor chip 120, and the like. An encapsulation form of the encapsulant 130 is not particularly limited, and may be a form in which the encapsulant 130 surrounds at least portions of the core member 110, the semiconductor chip 120, and the like. For example, the encapsulant 130 may cover the core member 110 and the inactive surface of the semiconductor chip 120, and fill spaces between walls of the through-hole 110H and the side surfaces of the semiconductor chip 120. In addition, the encapsulant 130 may also fill at least a portion of a space between the passivation layer 123 of the semiconductor chip 120 and the connection member 150. The encapsulant 130 may fill the through-hole 110H to thus serve as an adhesive and reduce buckling of the semiconductor chip 120 depending on certain materials.

A material of the encapsulant 130 is not particularly limited. For example, an insulating material may be used as the material of the encapsulant 130. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The connection member 140 may redistribute the connection pads 122 of the semiconductor chip 120. Several tens to several hundreds of connection pads 122 of the semiconductor chip 120 having various functions may be redistributed by the connection member 140, and may be physically or electrically externally connected through the electrical connection structures 170 depending on the functions. To this end, the connection member 140 may include redistribution layers 142a, 142b, and 142c. As an example, the connection member 140 may include a first insulating layer 141a disposed on the core member 110 and the active surface of the semiconductor chip 120, a first redistribution layer 142a disposed on the first insulating layer 141a, a first via 143a connecting the first insulating layer 141a and the connection pads 122 of the semiconductor chip 120 to each other, a second insulating layer 141b disposed on the first insulating layer 141a, a second redistribution layer 142b disposed on the second insulating layer 141b, a second via 143b penetrating through the second insulating layer 141b and connecting the first and second redistribution layers 142a and 142b to each other, a third insulating layer 141c disposed on the second insulating layer 141b, a third redistribution layer 142c disposed on the third insulating layer 141c, and a third via 143c penetrating through the third insulating layer 141c and the connecting the second and third redistribution layers 142b and 142c to each other. The first to third redistribution layers 142a, 142b, and 142c may be electrically connected to connection pads 122 of the semiconductor chip 120. However, the number of redistribution layers 142a, 142b, and 142c, insulating layers 141a, 142b, and 141c, and vias 143a, 143b, and 143c may be changed, if necessary.

An insulating material included in the insulating layers 141a, 141b, and 141c may also be, for example, a photosensitive insulating material. When the insulating layers 141a, 141b, and 141c has photosensitive properties, the insulating layers 141a, 141b, and 141c may be formed to have a smaller thickness, and fine pitches of the via layers 143a, 143b, and 143c may be achieved more easily. The insulating layers 141a, 141b, and 141c may be photosensitive insulating layers including an insulating resin and an inorganic filler. When the insulating layers 141a, 141b, and 141c are multiple layers, the materials of the insulating layers 141a, 141b, and 141c may be the same as each other, and may also be different from each other, if necessary. When the insulating layers 141a, 141b, and 141c are the multiple layers, the insulating layers 141a, 141b, and 141c may be integrated with each other depending on a process, such that a boundary therebetween may also not be apparent. A larger number of insulating layers than those illustrated in the drawing may be formed.

The redistribution layers 142a, 142b, and 142c may serve to substantially redistribute the connection pads 122. A material of each of the redistribution layers 142a, 142b, and 142c may be a conductive material such as copper (Cu), aluminum (Al), silver (Ag), tin (Sn), gold (Au), nickel (Ni), lead (Pb), titanium (Ti), or alloys thereof. The redistribution layers 142a, 142b, and 142c may perform various functions depending on designs of their corresponding layers. For example, the redistribution layers 142a, 142b, and 142c may include ground patterns, signal patterns, and the like. Here, the signal patterns may include various signals except for the ground patterns, the power patterns, and the like, such as data signals, and the like. In addition, the redistribution layers 142a, 142b, and 142c may include via pad patterns, connection terminal pad patterns, and the like.

The vias 143a, 143b, and 143c may electrically connect the redistribution layers 142a, 142b, and 142c, the connection pads 122, or the like, formed on different layers to each other, resulting in an electrical path in the fan-out semiconductor package 100A. A material of each of the vias 143a, 143b, and 143c may be a conductive material such as copper (Cu), aluminum (Al), silver (Ag), tin (Sn), gold (Au), nickel (Ni), lead (Pb), titanium (Ti), or alloys thereof. Each of the vias 143a, 143b, and 143c may be completely filled with the conductive material, or the conductive material may also be formed along a wall of each of the vias. In addition, each of the vias 143a, 143b, and 143c may have all of the shapes known in the related art, such as a tapered shape, a cylindrical shape, and the like.

According to the present exemplary embodiment, the conductive via 144 connected to the passive element 124 among the conductive vias 143a, 143b, and 143c may have a multiple via shape having a plurality of sub-vias V. A width of each sub-via V may be gradually decreased in a thickness direction (a vertical direction in the drawings from the connection member 140 towards the passive element 124) of the fan-out semiconductor package 100A. That is, each sub-via V may have an upper portion having a width less than a lower portion thereof. Thus, the upper portions of the plurality of sub-vias V may be spaced-apart from each other. The lower portions of the plurality of sub-vias V may be integrated or be in contact with each other. Thus, side surfaces of adjacent sub-vias V may be in contact with each other. In addition, in the case of the conductive via 144 having such a multiple via shape, a region (an upper portion in the drawings) having a relatively narrow width in the plurality of sub-vias V may be connected to the passive element 124. In one example, the upper portions of the plurality of sub-vias V may be in direct contact with a respective one of the terminals 124a/124b of the passive element 124. Further, the plurality of sub-vias V included in the conductive via 144 of the multiple via shape may be separated from each other in the region in which the plurality of sub-vias V are connected to the passive element 124, and the region in which the plurality of sub-vias V are separated from each other may be filled with an insulating material, such as the insulating layer 141a.

Since the passive element has a relatively small size, sizes of the terminals 124a and 124b included in the passive element 124 may also be small. Therefore, it is not easy to implement a stable electrical connection structure. When the size (i.e., a lateral dimension such as a width) of the via is reduced, an aspect ratio (a ratio of thickness to width) of the via may be increased. In this case, to form a via having a structure similar to that of the conductive via 132a, 142b, or 143c, a material constituting the via may grow faster from wall surface regions of the via than from an upper surface (i.e., a contact surface between the via and a respective one of the terminals 124a and 124b) during the formation of the via. Thus, there is a high possibility of occurrence of voids, when portions of the via growing from the wall surface regions merge with each other to stop growth of another portion of the via from the upper surface. In addition, when the size (i.e., the width) of the via similar to that of the conductive via 132a, 142b, or 143c is increased for stable connection, a volume to be plated as in a via 44 of FIG. 10B is increased, such that a possibility of occurrence of dimple may be increased.

According to the present exemplary embodiment, the via 124 connected to the passive element 124 may have the multiple via structure in which the plurality of sub-vias V are partially overlapped with each other. Such an overlapped structure of the plurality of sub-vias V of the via 124 may be obtained by using an interference phenomenon of light, for example, during an exposure process for forming holes in an insulating layer such as the insulating layers 141a. Accordingly, as illustrated in FIG. 10A, each of the plurality of sub-vias V may have a quasi conical shape having a lower surface and an upper surface of a circular shape, and the plurality sub-vias V may be integrated in a first region and may be separated from each other in a second region having a width narrower than that of the first region. Meanwhile, when the opening in which the via 124 is formed is formed by using the exposure process, the width of the via 124 may be relatively wider in a direction in which light is irradiated, and the width of the via 124 may be relatively narrower in an opposite direction. However, the upper surface and the lower surface herein are in relation to the forms illustrated in the drawings, and a reference may be changed depending on a method for disposing the fan-out semiconductor package 100A.

Since the volume of the via 144 may be reduced as compared to the conventional structure 44 by using the separated structure of the plurality of sub-vias V, the occurrence of dimple may be reduced. One of the reasons is because condensation of plating accelerator actively occurs due to the reduced volume of the via 144. Referring to FIG. 10A, regions corresponding to the lower surfaces of the plurality of sub-vias V may be integrated, and the integrated region may be integrated with the redistribution layer 142a. In addition, a region (a lower surface in the drawing) of the redistribution layer 142a facing the plurality of sub-vias V among the regions integrated with the integrated region may have a convex shape, and in this case, the region having the convex shape may be a region corresponding to each of the plurality of sub-vias V. As such, the via 144 having a multiple structure may have protrusions formed in a growth direction, and since a mismatch of growth speed in wall surfaces of the via 144 and the remaining regions is reduced, the formation of the voids may be significantly reduced.

As a result, the via 144 of the multiple structure used in the present exemplary embodiment has a structure in which the voids and the dimples are reduced, such that it may provide a stable electrical connection structure and may be effectively used in connecting with the passive element 124 having a relatively small size.

It should be appreciated that using the vias 144 having the multiple via structure to connect to the terminals 124*a* and 124*b* of the passive element 124 is merely an example. The vias 144 having the multiple via structure may be used to connect other electrode pads/terminals, such as the connection pads 122 of the semiconductor chip 120, according to design particulars.

The passivation layer 150 may protect the connection member 140 from external physical or chemical impacts. The passivation layer 150 may have openings 151 exposing at least portions of the redistribution layers 142*c* of the connection member 140. The number of openings 151 formed in the passivation layer 150 may be several tens to several thousands. A material of the passivation layer 150 is not particularly limited. For example, an insulating material may be used as the material of the passivation layer 150. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a solder resist may also be used.

The underbump metal layer 160 may improve connection reliability of the electrical connection structures 170 to improve board level reliability of the fan-out semiconductor package 100A. The underbump metal layer 160 may be connected to the redistribution layers 142*a*, 142*b*, and 142*c* of the connection member 140 exposed through the openings 151 of the passivation layer 150. The underbump metal layer 160 may be formed in the openings 151 of the passivation layer 150 by the known metallization method using the known conductive metal such as a metal, but is not limited thereto.

The electrical connection structures 170 may physically or electrically externally connect the fan-out semiconductor package 100A. For example, the fan-out semiconductor package 100A may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, and may be sufficiently modified depending on design particulars by those skilled in the art. For example, the electrical connection structures 170 may be provided in an amount of several tens to several thousands according to the number of connection pads 122, or may be provided in an amount of several tens to several thousands or more or several tens to several thousands or less. When the electrical connection structures 170 are solder balls, the electrical connection structures 170 may cover side surfaces of the underbump metal layer 160 extending onto one surface of the passivation layer 150, and connection reliability may be more excellent.

At least one of the electrical connection structures 170 may be disposed in a fan-out region. The fan-out region is a region except for a region in which the semiconductor chip 120 is disposed. The fan-out package may have greater reliability than that of a fan-in package, may implement a plurality of I/O terminals, and may easily perform 3D interconnection In addition, as compared to a ball grid array (BGA) package, a land grid array (LGA) package, or the like, the fan-out package may be manufactured to have a small thickness, and may have price competitiveness.

Meanwhile, although not illustrated in the drawings, a metal thin film may be formed on the walls of the through-hole 110H, if necessary, in order to dissipate heat or block electromagnetic waves. In addition, a plurality of semiconductor chips 120 performing functions that are the same as or different from each other may be disposed in the through-hole 110H, if necessary. In addition, a separate passive component such as an inductor, a capacitor, or the like, may be disposed in the through-hole 110H, if necessary. In addition, a passive component, for example, a surface mounted technology (SMT) component including an inductor, a capacitor, or the like, may be disposed on a surface of the passivation layer 150, if necessary.

Figure 13:
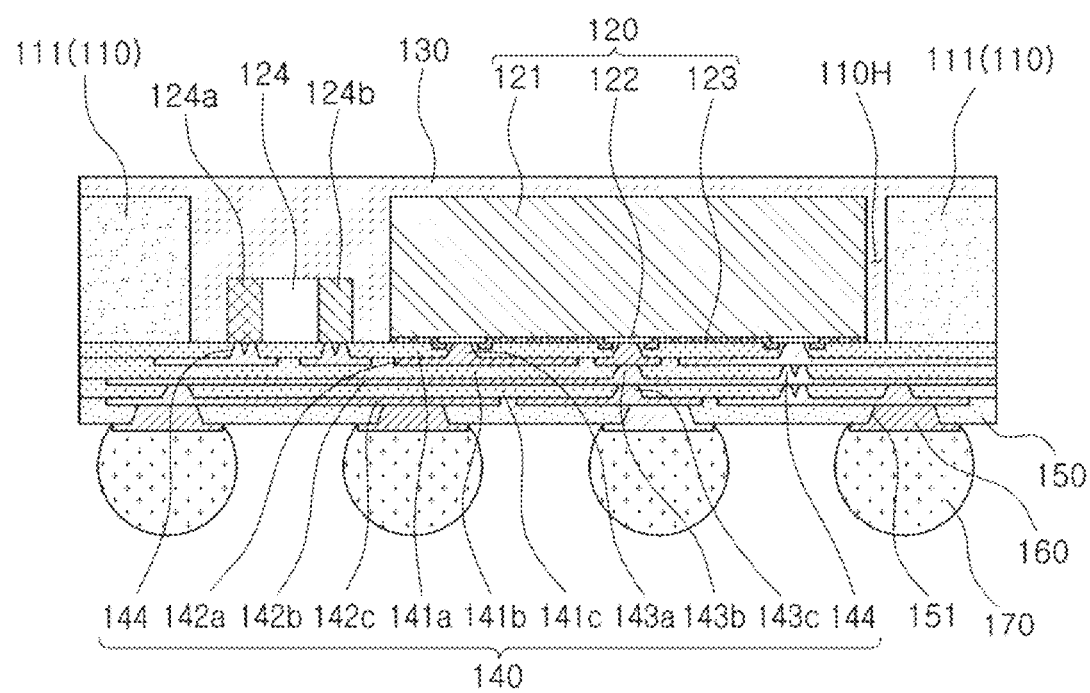

A modified example of a fan-out semiconductor package illustrated in FIGS. 13 through 15 will be described. First, in the case of a modified example of FIG. 13, the via 144 of the multiple structure described above may also applied to a connection of other components, not the passive element 124. In other words, at least a portion 144 among those which are not connected to the passive element 124 in the conductive vias 143*a*, 143*b*, and 143*c* may have the multiple via shape described above. By using the via 144 of the multiple structure therein, the connection member 140 may have a stable electrical connection structure.

Figure 14:
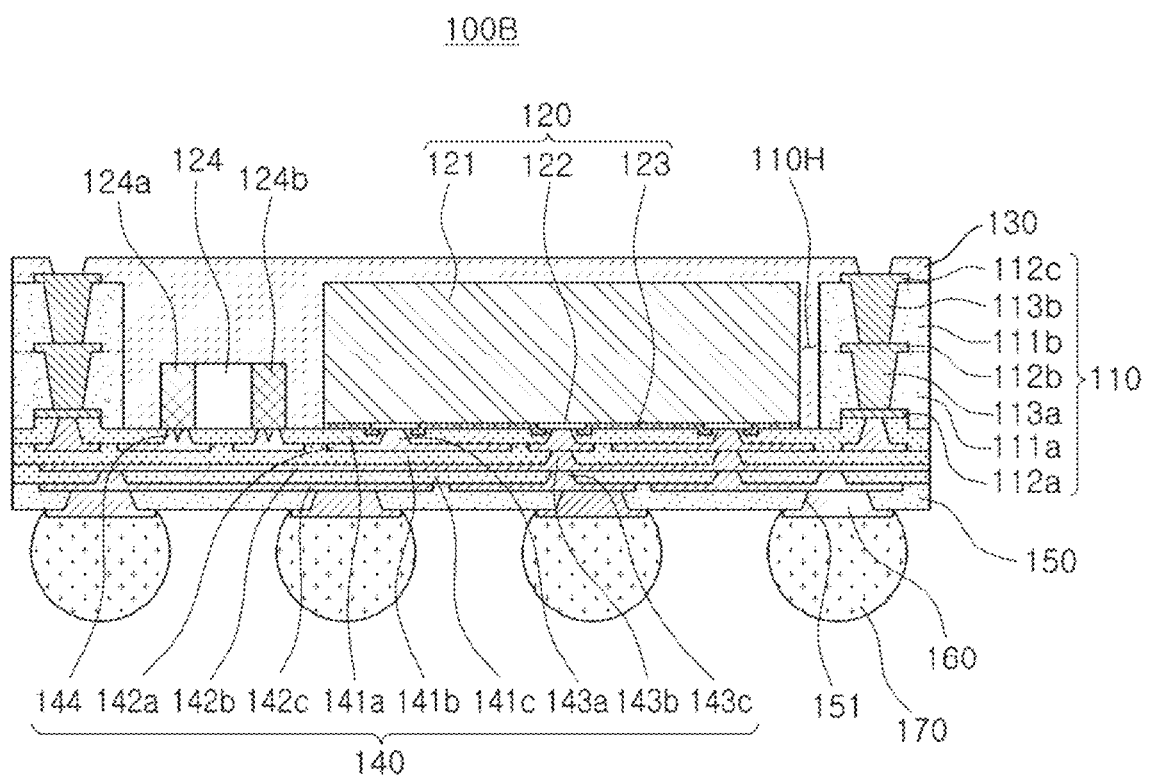
Figure 15:
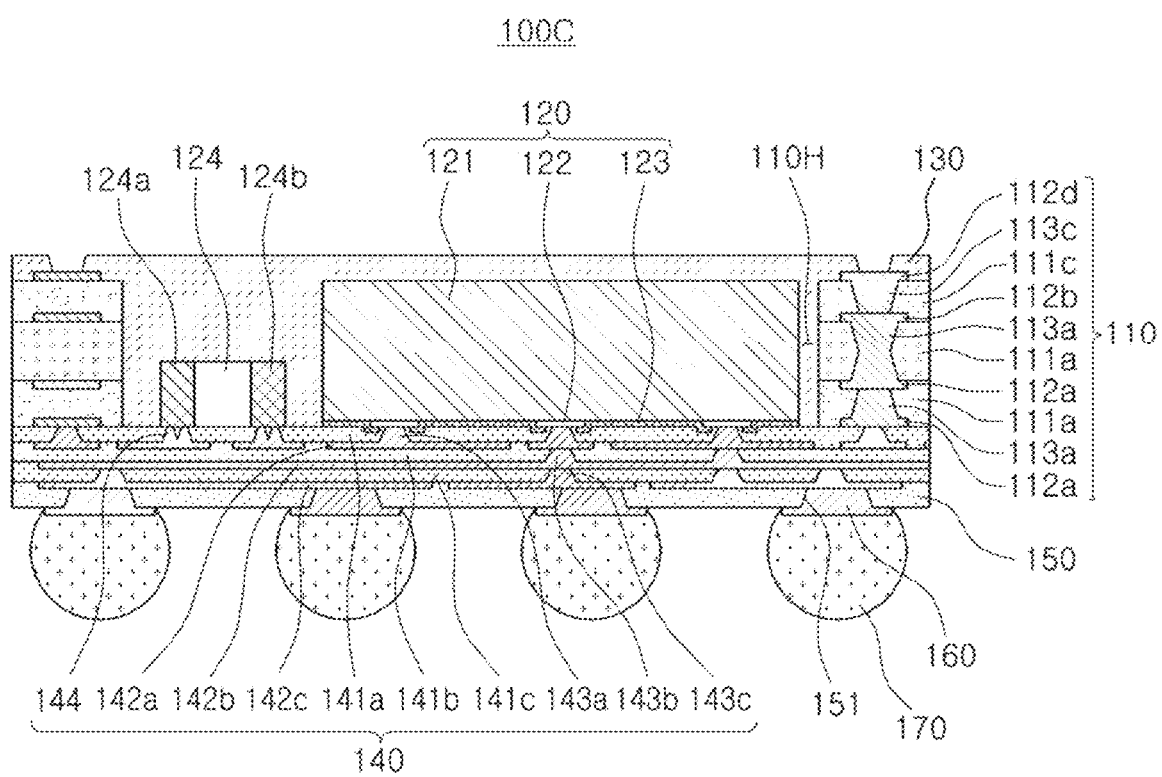

In a fan-out semiconductor package 100B according to an exemplary embodiment of FIG. 14, a plurality of conductive vias serving to perform interlayer electricity conduction are installed in the core member 110. In detail, the core member 110 may include a first insulating layer 111*a* in contact with the connection member 140, a first wiring layer 112*a* in contact with the connection member 140 and embedded in the first insulating layer 111*a*, a second wiring layer 112*b* disposed on the other surface of the first insulating layer 111*a* opposing one surface of the first insulating layer 111*a* in which the first wiring layer 112*a* is embedded, a second insulating layer 111*b* disposed on the first insulating layer 111*a* and covering the second wiring layer 112*b*, and a third wiring layer 112*c* disposed on the second insulating layer 111*b*. The first to third wiring layers 112*a*, 112*b*, and 112*c* may be electrically connected to connection pads 122. The first and second wiring layers 112a and 112b and the second and third wiring layers 112b and 112c may be electrically connected to each other through first and second vias 113a and 113b penetrating through the first and second insulating layers 111a and 111b, respectively.

When the first wiring layer 112a is embedded in the first insulating layer 111a, a step generated due to a thickness of the first wiring layer 112a may be significantly reduced, and an insulating distance of the connection member 140 may thus become constant. That is, a difference between a distance from a first redistribution layer 142a of the connection member 140 to a lower surface of the first insulating layer 111a and a distance from the first redistribution layer 142a of the connection member 140 to the connection pad 122 of a semiconductor chip 120 may be smaller than a thickness of the first wiring layer 112a. Therefore, a high density wiring design of the connection member 140 may be easy.

As illustrated in FIG. 14, the lower surface of the first wiring layer 112a of the core member 110 may be disposed on a level above a lower surface of the connection pad 122 of the semiconductor chip 120. In addition, a distance between a first redistribution layer 142a of the connection member 140 and the first wiring layer 112a of the core member 110 may be greater than that between the first redistribution layer 142a of the connection member 140 and the connection pad 122 of the semiconductor chip 120. The reason is that the first wiring layer 112a may be recessed into the insulating layer 111. As described above, when the first wiring layer 112a is recessed into the first insulating layer 111a, such that the lower surface of the first insulating layer 111a and the lower surface of the first wiring layer 112a have a step therebetween, a phenomenon in which a material of the encapsulant 130 bleeds to pollute the first wiring layer 112a may be prevented. The second wiring layer 112b of the core member 110 may be disposed between an active surface and an inactive surface of the semiconductor chip 120. The core member 110 may be formed at a thickness corresponding to that of the semiconductor chip 120. Therefore, the second wiring layer 112b formed in the core member 110 may be disposed on a level between the active surface and the inactive surface of the semiconductor chip 120.

Thicknesses of the wiring layers 112a, 112b, and 112c of the core member 110 may be greater than those of the redistribution layers 142a, 142b, and 142c of the connection member 140. Since the core member 110 may have a thickness equal to or greater than that of the semiconductor chip 120, the wiring layers 112a, 112b, and 112c may be formed at larger sizes depending on a scale of the core member 110. On the other hand, the redistribution layers 142a, 142b, and 142c of the connection member 140 may be formed at sizes relatively smaller than those of the wiring layers 112a, 112b, and 112c for thinness.

A material of each of the insulating layers 111a and 111b is not particularly limited. For example, an insulating material may be used as the material of the insulating layers 111a and 111b. In this case, the insulating material may be a thermosetting resin such as an epoxy resin, a thermoplastic resin such as a polyimide resin, a resin in which the thermosetting resin or the thermoplastic resin is mixed with an inorganic filler, or impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like. Alternatively, a PID resin may also be used as the insulating material.

The wiring layers 112a, 112b, and 112c may serve to redistribute the connection pads 122 of the semiconductor chip 120. A material of each of the wiring layers 112a, 112b, and 112c may be a conductive material such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on designs of their corresponding layers. For example, the wiring layers 112a, 112b, and 112c may include ground patterns, signal patterns, and the like. Here, the signal patterns may include various signals except for the ground patterns, the power patterns, and the like, such as data signals, and the like. In addition, the wiring layers 112a, 112b, and 112c may include via pads, wire pads, connection terminal pads, and the like.

The vias 113a and 113b may electrically connect the wiring layers 112a, 112b, and 112c formed on different layers to each other, resulting in an electrical path in the core member 110. A material of each of the vias 113a and 113b may be a conductive material. Each of the vias 113a and 113b may be completely filled with a conductive material, or a conductive material may also be formed along a wall of each of via holes. In addition, each of the vias 113a and 113b may have all of the shapes known in the related art, such as a tapered shape, a cylindrical shape, and the like. When holes for the first vias 113a are formed, some of the pads of the first wiring layer 112a may serve as a stopper, and it may thus be advantageous in a process that each of the first vias 113a has the tapered shape of which a width of an upper surface is greater than that of a lower surface. In this case, the first vias 113a may be integrated with pad patterns of the second wiring layer 112b. In addition, when holes for the second vias 113b are formed, some of the pads of the second wiring layer 112b may serve as a stopper, and it may thus be advantageous in a process that each of the second vias 113b has the tapered shape of which a width of an upper surface is greater than that of a lower surface. In this case, the second vias 113b may be integrated with pad patterns of the third wiring layer 112c.

A fan-out semiconductor package 100C according to another modified example illustrated in FIG. 15 will be described. In the fan-out semiconductor package 100C according to another modified example, a core member 110 may include a first insulating layer 111a, a first wiring layer 112a and a second wiring layer 112b disposed on opposite surfaces of the first insulating layer 111a, respectively, a second insulating layer 111b disposed on the first insulating layer 111a and covering the first wiring layer 112a, a third wiring layer 112c disposed on the second insulating layer 111b, a third insulating layer 111c disposed on the first insulating layer 111a and covering the second wiring layer 112b, and a fourth wiring layer 112d disposed on the third insulating layer 111c. The first to fourth wiring layers 112a, 112b, 112c, and 112d may be electrically connected to connection pads 122. Since the core member 110 may include a larger number of wiring layers 112a, 112b, 112c, and 112d, a connection member 140 may be further simplified. Therefore, a decrease in a yield depending on a defect occurring in a process of forming the connection member 140 may be suppressed. Meanwhile, the first to fourth wiring layers 112a, 112b, 112c, and 112d may be electrically connected to each other through first to third vias 113a, 113b, and 113c penetrating through the first to third insulating layers 111a, 111b, and 111c, respectively.

The first insulating layer 111a may have a thickness greater than those of the second insulating layer 111b and the third insulating layer 111c. The first insulating layer 111a may be relatively thick in order to maintain rigidity, and the second insulating layer 111b and the third insulating layer 111c may be introduced in order to form a larger number of wiring layers 112c and 112d. The first insulating layer 111a may include an insulating material different from those of the second insulating layer 111b and the third insulating layer 111c. For example, the first insulating layer 111a may be, for example, prepreg including a core material, a filler, and an insulating resin, and the second insulating layer 111b and the third insulating layer 111c may be an ABF or a PID film including a filler and an insulating resin. However, the materials of the first insulating layer 111a and the second and third insulating layers 111b and 111c are not limited thereto. Similarly, the first vias 113a penetrating through the first insulating layer 111a may have a diameter greater than those of second vias 113b and third vias 113c each penetrating through the second insulating layer 111b and the third insulating layer 111c.

A lower surface of the third wiring layer 112c of the core member 110 may be disposed on a level below a lower surface of the connection pad 122 of a semiconductor chip 120. In addition, a distance between a first redistribution layer 142a of the connection member 140 and the third wiring layer 112c of the core member 110 may be smaller than that between the first redistribution layer 142a of the connection member 140 and the connection pad 122 of the semiconductor chip 120. The reason is that the third wiring layer 112c may be disposed on the second insulating layer 111b in protruding form, resulting in being in contact with the connection member 140. The first wiring layer 112a and the second wiring layer 112b of the core member 110 may be disposed between an active surface and an inactive surface of the semiconductor chip 120. The core member 110 may be formed at a thickness corresponding to that of the semiconductor chip 120. Therefore, the first wiring layer 112a and the second wiring layer 112b formed in the core member 110 may be disposed on the level between the active surface and the inactive surface of the semiconductor chip 120.

Thicknesses of the wiring layers 112a, 112b, 112c, and 112d of the core member 110 may be greater than those of the redistribution layers 142a, 142b, and 142c of the connection member 140. Since the core member 110 may have a thickness equal to or greater than that of the semiconductor chip 120, the wiring layers 112a, 112b, 112c, and 112d may also be formed at larger sizes. On the other hand, the redistribution layers 142a, 142b, and 142c of the connection member 140 may be formed at relatively small sizes for thinness.

The contents described with reference to FIGS. 9 through 13 may be applied to other components in addition to the components described in relation to the exemplary embodiments of FIGS. 14 and 15, and since a detailed description thereof is substantially the same as that described in the fan-out semiconductor package 100A and the like, it will be omitted.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" means the concept including a physical connection and a physical disconnection. It can be understood that when an element is referred to with "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

As set forth above, according to the exemplary embodiments in the present disclosure, the conductive vias included in the fan-out semiconductor package may form the stable electrical connection structure with the passive elements, and the like.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
   a connection member comprising:
      an insulating layer;
      a redistribution layer; and
      conductive vias penetrating through the insulating layer and connected to the redistribution layer;
   a semiconductor chip; and
   a passive chip comprising:
      a first terminal; and
      a second terminal, the semiconductor chip and the passive chip being disposed on the connection member and electrically connected to the redistribution layer,
   wherein a conductive via connected to the passive chip among the conductive vias has a multiple via shape including a plurality of sub-vias, each sub-via of the plurality of sub-vias of the conductive via being connected to one of the first terminal or the second terminal of the passive chip, and
   wherein one or more of the conductive vias which are not connected to the passive chip among the conductive vias have the multiple via shape.

2. The fan-out semiconductor package of claim 1, wherein:
   a width of each sub-via is decreased in a thickness direction,
   first end portions of the plurality of sub-vias are integrated with each other, and the passive chip is connected to second end portions of the plurality of sub-vias opposing the first end portions.

3. The fan-out semiconductor package of claim 2, wherein the second end portions of the plurality of sub-vias connected to the passive chip are separated from each other.

4. The fan-out semiconductor package of claim 3, wherein the insulating layer fills spaces between the second end portions of the plurality of sub-vias.

5. The fan-out semiconductor package of claim 3, wherein the first end portions of the plurality of sub-vias are integrated with the redistribution layer.

6. The fan-out semiconductor package of claim 5, wherein a region of the redistribution layer opposing the plurality of sub-vias has a convex shape.

7. The fan-out semiconductor package of claim 6, wherein the region of the redistribution layer corresponds to one of the plurality of sub-vias.

8. The fan-out semiconductor package of claim 1, wherein each of the plurality of sub-vias has a quasi conical shape in which a lower surface and an upper surface have a circular shape.

9. A fan-out semiconductor package comprising:
a connection member comprising:
an insulating layer;
a redistribution layer; and
conductive vias penetrating through the insulating layer and connected to the redistribution layer;
a core member disposed on the connection member and having a through-hole;
a semiconductor chip; and
a passive chip comprising:
a first terminal; and
a second terminal, the semiconductor chip and the passive chip being disposed on the connection member and electrically connected to the redistribution layer,
wherein a conductive via connected to the passive chip among the conductive vias has a multiple via shape including a plurality of sub-vias, each sub-via of the plurality of sub-vias of the conductive via being connected to one of the first terminal or the second terminal of the passive chip.

10. The fan-out semiconductor package of claim 9, wherein the semiconductor chip and the passive chip are disposed in the through-hole.

11. The fan-out semiconductor package of claim 10, wherein the through-hole includes a first through-hole in which the semiconductor chip is disposed and a second through-hole in which the passive chip is disposed.

12. The fan-out semiconductor package of claim 9, wherein the core member has a through-wiring structure.

13. The fan-out semiconductor package of claim 9, wherein the core member comprises:
a first insulating layer;
a first wiring layer in contact with the connection member and embedded in the first insulating layer; and
a second wiring layer disposed on a second surface of the first insulating layer opposing a first surface of the first insulating layer in which the first wiring layer is embedded, and
wherein the first wiring layer and the second wiring layer are electrically connected to the semiconductor chip.

14. The fan-out semiconductor package of claim 13, wherein the core member further comprises:
a second insulating layer disposed on the first insulating layer and covering the second wiring layer; and
a third wiring layer disposed on the second insulating layer, and
wherein the third wiring layer is electrically connected to the semiconductor chip.

15. The fan-out semiconductor package of claim 9, wherein the core member includes a first insulating layer, a first wiring layer and a second wiring layer disposed on opposite surfaces of the first insulating layer, respectively, a second insulating layer disposed on the first insulating layer and covering the first wiring layer, and a third wiring layer disposed on the second insulating layer, and
the first to third wiring layers are electrically connected to the semiconductor chip.

16. The fan-out semiconductor package of claim 15, wherein the core member further includes a third insulating layer disposed on the first insulating layer and covering the second wiring layer and a fourth wiring layer disposed on the third insulating layer, and
the fourth wiring layer is electrically connected to the semiconductor chip.

17. A package comprising:
a connection member comprising:
an insulating layer;
a redistribution layer; and
conductive vias penetrating through the insulating layer and connected to the redistribution layer; and
a passive component or a semiconductor chip, the passive component or the semiconductor chip being disposed on the connection member and electrically connected to the redistribution layer,
wherein:
one of the conductive vias has a multiple via shape including a plurality of sub-vias, and
a conductive pattern of the redistribution layer, on which the plurality of sub-vias are disposed, has a plurality of convex-shape structures opposing the plurality of sub-vias, a number of the plurality of convex-shape structures being equal to a number of the plurality of sub-vias.

18. The package of claim 17, wherein side surfaces of adjacent ones of the plurality of sub-vias are in contact with each other.

19. The package of claim 17, wherein the passive component comprises:
a first terminal; and
a second terminal,
wherein each sub-via of the plurality of sub-vias is connected to one of the first terminal or the second terminal of the passive component.

* * * * *